(12) United States Patent
Yamamoto et al.

(10) Patent No.: US 6,940,750 B2
(45) Date of Patent: Sep. 6, 2005

(54) MAGNETIC MEMORY, MAGNETIC MEMORY ARRAY, METHOD FOR FABRICATING A MAGNETIC MEMORY, METHOD FOR RECORDING IN A MAGNETIC MEMORY AND METHOD FOR READING OUT FROM A MAGNETIC MEMORY

(75) Inventors: Masahiko Yamamoto, Minoo (JP); Ryoichi Nakatani, Toyonaka (JP); Yasushi Endo, Toyonaka (JP)

(73) Assignee: Osaka University, Osaka (JP)

( * ) Notice: Subject to any disclaimer, the term of this patent is extended or adjusted under 35 U.S.C. 154(b) by 76 days.

(21) Appl. No.: 10/680,157

(22) Filed: Oct. 8, 2003

(65) Prior Publication Data

US 2004/0130955 A1 Jul. 8, 2004

(30) Foreign Application Priority Data

Oct. 18, 2002 (JP) ........................................ 2002-304124

(51) Int. Cl.⁷ ............................................... G11C 11/15
(52) U.S. Cl. .......................... 365/173; 365/48; 365/33; 365/55; 365/74; 365/97; 365/171; 365/66; 365/209
(58) Field of Search ............................. 365/73, 48, 33, 365/55, 74, 97, 171, 66, 209

(56) References Cited

U.S. PATENT DOCUMENTS

| | | |
|---|---|---|
| 5,432,373 A | 7/1995 | Johnson |
| 5,475,304 A | 12/1995 | Prinz |
| 5,486,967 A * | 1/1996 | Tanaka et al. ............... 360/318 |
| 5,587,943 A * | 12/1996 | Torok et al. ................. 365/158 |
| 5,673,220 A * | 9/1997 | Gendlin ....................... 365/157 |
| 5,718,983 A * | 2/1998 | Gendlin ....................... 428/611 |
| 6,351,410 B1 * | 2/2002 | Nakao et al. ................ 365/171 |
| 6,743,340 B2 * | 6/2004 | Fu ........................ 204/192.12 |
| 2004/0094785 A1 * | 5/2004 | Zhu et al. .................... 257/295 |
| 2004/0165426 A1 * | 8/2004 | Yamamoto et al. .......... 365/171 |

FOREIGN PATENT DOCUMENTS

| | | |
|---|---|---|
| EP | 0 375 646 A2 | 6/1990 |
| WO | WO 00/10178 | 2/2000 |
| WO | WO 03/032336 A1 | 4/2003 |

OTHER PUBLICATIONS

Jian–Gang Zhu et al. "Ultrahigh Density Vertical Magnetoresistive Random Access Memory (Invited)," Journal of Applied Physics, vol. 87, No. 9, May 1, 2000, pp. 6668–6673.

M. Kläui et al. "Vortex Circulation Control in Mesoscopic Ring Mangets," Applied Physics Letters, vol. 78, No. 21, May 21, 2001, pp. 3268–3270.

M. Schneider et al. "Magnetic Switching of Single Vortex Permalloy Elements," Applied Physics Letters, vol. 79, No. 19, Nov. 5, 2001, pp. 3113–3115.

M. Schneider et al.; "Lorentz microscopy of circular ferromagnetic permalloy nanodisks"; Applied Physics Letters; American Institute of Physics., New York, US, vol. 77, No. 18; Oct. 30, 2000; pp 2909–2911.

* cited by examiner

Primary Examiner—Viet Q. Nguyen
(74) Attorney, Agent, or Firm—Oliff & Berridge, PLC

(57) ABSTRACT

A magnetic memory includes a magnetic substance composed of a disc-shaped first magnetic layer and a ring-shaped second magnetic layer which is formed on the first magnetic layer.

34 Claims, 7 Drawing Sheets

MAGNETIC MEMORY, MAGNETIC MEMORY ARRAY, METHOD FOR FABRICATING A MAGNETIC MEMORY, METHOD FOR RECORDING IN A MAGNETIC MEMORY AND METHOD FOR READING OUT FROM A MAGNETIC MEMORY

BACKGROUND OF THE INVENTION

1. Field of the Invention

This invention relates to a nonvolatile magnetic memory and a nonvolatile magnetic memory array which are preferably usable as a magnetic random access memory (MRAM). Also, this invention relates to a method for fabricating the nonvolatile magnetic memory. Moreover, this invention relates to a method for recording in the nonvolatile magnetic memory and a method for reading out from the nonvolatile magnetic memory.

2. Description of the Prior Art

Various electronic devices have been employed under a specific condition such as an aero-space, and thus, it is desired to establish a recording device where once stored information can not be deleted by the irradiation of a radioactive ray. In this point of view, large radioactive-resistance and nonvolatile MRAMs having their respective simply structured magnetic memory cells are researched and developed.

Conventionally, such a magnetic memory cell is shaped rectangular, and information "0" or "1" is stored on the magnetic direction of the magnetic memory cell. With the conventional magnetic memory cell, however, the magnetic flux originated from the magnetization is leaked outside from the magnetic memory cell due to the configuration thereof. In order to increase the recording capacity of the MRAM, in contrast, such an attempt is made as to arrange a plurality of magnetic memory cells in high density. In this case, however, the leaked magnetic flux affects significantly on the adjacent magnetic memory cells, and thus, the intended high density MRAM can not be realized.

In this point of view, the inventors have developed a ring-shaped magnetic memory where a right handed (clockwise) magnetization or a left-handed (anticlockwise) magnetization is created in vortex, and information "0" or "1" is stored on the rotative direction of the magnetization thereof (Japanese Patent application 2002-73681).

In this case, since a magnetic flux is not leaked from the magnetic memory, if a plurality of magnetic memory are arranged in high density as mentioned above, the leaked magnetic flux can not almost affect on the adjacent magnetic memories, so that a high density MRAM can be realized.

With the ring-shaped magnetic memory, however, the motion of the magnetic domain wall is prevented due to the inside external wall, so that the magnetization can not be easily inverted. In order to control the right handed magnetization and the left handed magnetization, it is required to flow current perpendicular to the ring-shaped magnetic memory and thus, to generate rotative magnetic field in the magnetic memory along the ring-shaped configuration, as indicated in "Journal of Applied Physics, 87, 9, p6668–6673 (2001)". Therefore, the control of the magnetic condition of the ring-shaped magnetic memory is very difficult and complicated, so that the ring-shaped magnetic memory can not be practically employed.

SUMMERY OF THE INVENTION

It is an object of the present invention to provide a magnetic memory and a magnetic memory array which can generate a right handed (clockwise) vortex magnetization and a left handed (anticlockwise) vortex magnetization easily to realize stable recording performance on the direction of the vortex magnetization. It is another object of the present invention to provide a method for fabricating the magnetic memory, a method for recording in the magnetic memory and a method for reading out from the magnetic memory.

In order to achieve the above-mentioned objects, this invention relates to a magnetic memory comprising a magnetic substance composed of a disc-shaped first magnetic layer and a ring-shaped second magnetic layer which is formed on the first magnetic layer.

The inventors found out through vast researches and developments that if the ring-shaped magnetic layer is formed adjacent to, concretely on the disc-shaped magnetic layer, to constitute the magnetic memory, and a given external magnetic field is applied to the magnetic memory, the disc-shaped magnetic layer is magnetized in vortex. In this case, the vortex magnetization of the disc-shaped magnetic layer functions as nucleus to generate the right handed (clockwise) magnetization and the left handed (anticlockwise) magnetization easily in the ring-shaped magnetic layer along the surfaces thereof.

If the polarity of the external magnetic field is varied, the direction of the vortex magnetization can be varied in the disc-shaped magnetic layer, so that the direction of the vortex magnetization of the ring-shaped magnetic layer can be easily varied to the left handed (anticlockwise) magnetization from the right handed (clockwise) magnetization or to the right handed (clockwise) magnetization from the left handed (anticlockwise) magnetization. Therefore, if the information "0" or "1" is stored on the direction of the vortex magnetization of the ring-shaped magnetic layer, the magnetic memory, including the magnetic substance composed of the disc-shaped magnetic layer and the ring-shaped magnetic layer, can be employed practically.

In the magnetic memory of the present invention, since the ring-shaped magnetic layer is formed, magnetic flux can not be leaked from the vortex magnetization. Therefore, if the magnetic memories are arranged in high density to constitute the magnetic memory array, the leaked magnetic flux can not affect on the adjacent magnetic memories. As a result, the magnetic memory array can be employed practically as a high density magnetic memory array.

In a preferred embodiment of the present invention, the periphery of the magnetic substance composed of the disc-shaped magnetic layer and the ring-shaped magnetic layer is notched. In this case, the right handed (clockwise) vortex magnetization and the left handed (anticlockwise) vortex magnetization can be easily generated in the ring-shaped magnetic layer of the magnetic memory, and information "0" or "1" can be easily stored in the magnetic memory on the direction of the vortex magnetization on good control of the direction of the vortex magnetization. Therefore, the magnetic memory can be employed more practically.

Other features and advantages of the magnetic memory of the present invention will be described below. Also, a fabricating method, a recording method and a reading method for the magnetic memory will be described below.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to the accompanying drawings.

Figure 1:
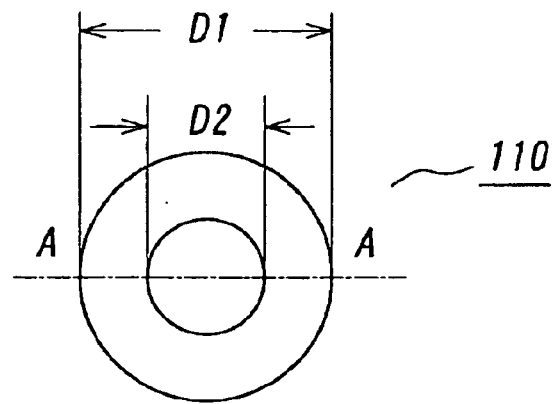
FIG. 1 is a top plan view showing a magnetic substance constituting a magnetic memory according to the present invention.
Figure 2:
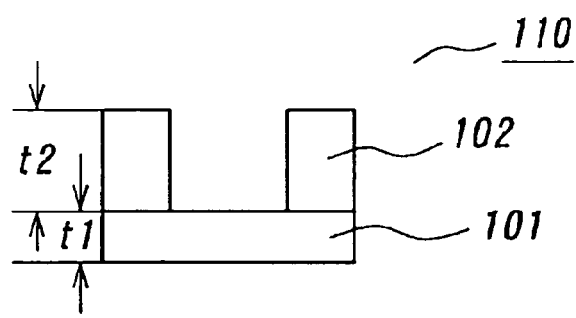
FIG. 2 is a cross sectional view of the magnetic substance shown in FIG. 1, taken on line "A—A"
Figure 3:
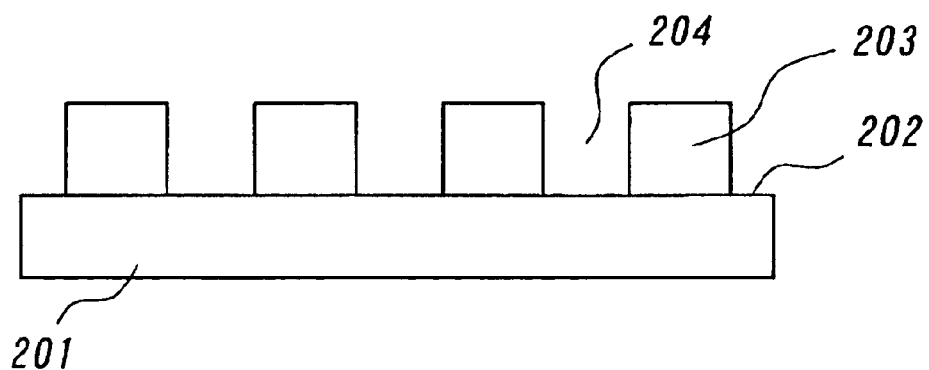
FIG. 3 is a cross sectional view showing one step in fabricating the magnetic memory of the present invention.

FIG. 1 is a top plan view showing a magnetic substance constituting a magnetic memory according to the present invention, and FIG. 2 is a cross sectional view of the magnetic substance shown in FIG. 1, taken on line "A—A". The magnetic substance 110 illustrated in FIGS. 1 and 2 includes a disc-shaped first magnetic layer 101 and a ring-shaped magnetic layer 102 formed on the first magnetic layer 101.

It is desired to set the ratio (D2/D1) of the inside diameter D2 to the outside diameter D1 of the second magnetic layer 102 within 0.1–0.8, particularly within 0.3–0.6. In this case, when an external magnetic field is applied to the magnetic substance 110, in the second magnetic layer 102, the magnetic domain wall can be moved easily without the influence of the inside external wall. Therefore, the vortex magnetization of the first magnetic layer 101 which is generated by the external magnetic field functions as nucleus to form a given vortex magnetization in the first magnetic layer 101 along the surfaces thereof. In this case, the direction of the vortex magnetization in the second magnetic layer 102 can be easily controlled.

Concretely, the outside diameter D1 of the second magnetic layer 102 is preferably set within 100–1500 nm, and the inside diameter of the second magnetic layer 102 is preferably set within 10–1200 nm. Also, it is desired to set the ratio (t1/t2) of the thickness t1 of the first magnetic layer 101 to the thickness t2 of the second magnetic layer 102 within ⅕–5, particularly within ½–2. In this case, the first magnetic layer 101 is magnetically combined with the second magnetic layer 102 in good condition, so that the vortex magnetization can be easily formed in the second magnetic layer 102, originated from the vortex magnetization of the first magnetic layer 101 as nucleus. In this case, the direction of the vortex magnetization in the second magnetic layer 102 can be easily controlled.

Concretely, the thickness t1 of the first magnetic layer 101 is preferably set within 4–20 nm, and the thickness t2 of the second magnetic layer 102 is preferably set within 4–20 nm.

The first magnetic layer 101 and the second magnetic layer 102 may be made of room temperature ferromagnetic material such as Ni—Fe, Ni—Fe—Co, Co—Fe or Ni—Fe—Co. Herein, the "room temperature ferromagnetic material" means a ferromagnetic material which can exhibit ferromagnetic properties at room temperature, and thus, encompasses another well known magnetic material in addition to the above-mentioned magnetic materials.

The magnetic memory illustrated in FIGS. 1 and 2 can be fabricated as follows. FIGS. 3–6 are process drawings showing the fabricating method of the magnetic memory.

Figure 4:
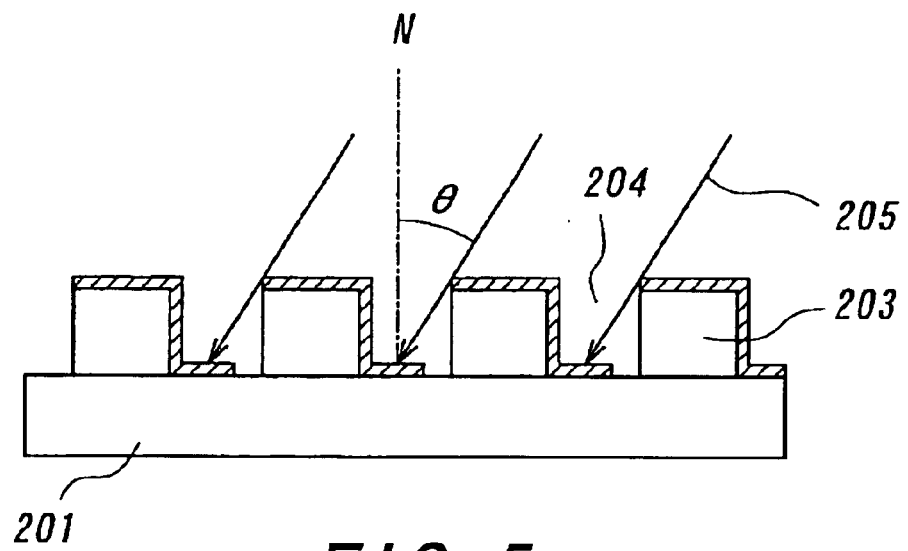
FIG. 4 is a cross sectional view showing the step after the step shown in FIG. 3.
Figure 5:
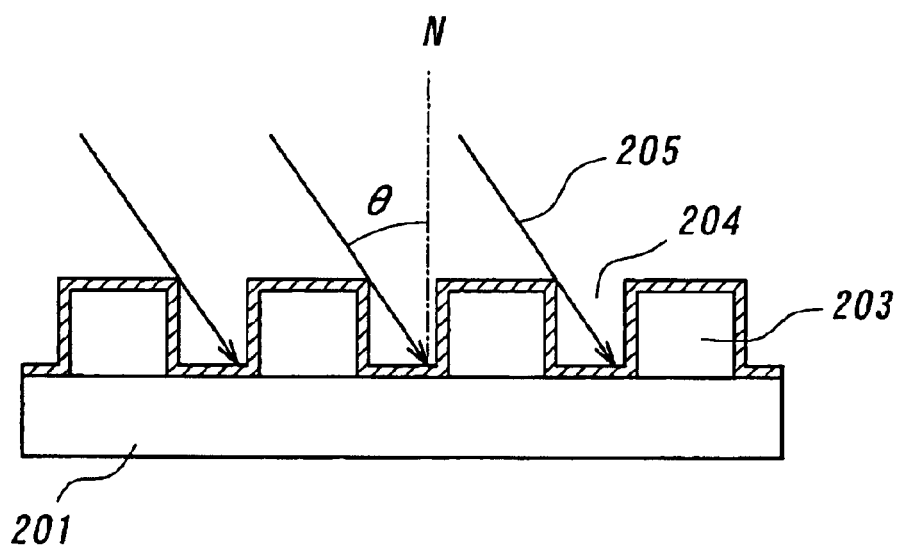
FIG. 5 is a cross sectional view showing the step after the step shown in FIG. 4.

As shown in FIG. 1, first of all, a given substrate 201 is prepared, and a mask 203 with circular openings 204 is formed of resist on the main surface 202 of the substrate 201. Then, magnetic particles 205 are introduced into the openings 204 of the mask 203 on the main surface 202 of the substrate 201 by the inclination angle of θ from the normal line to the main surface 202 of the substrate 201 while the substrate 201 is rotated at a predetermined velocity, e.g., 60 rpm. As shown in FIGS. 4 and 5, in this case, the magnetic particles 205 are deposited on the main surface 202 of the substrate 201 and the side surfaces of the openings 204 of the mask 204.

Figure 6:
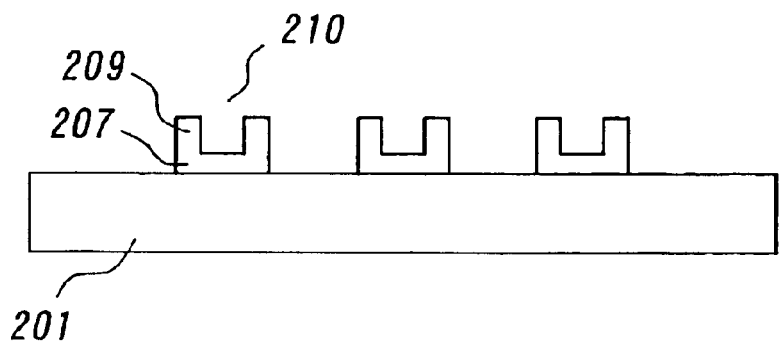
FIG. 6 is a cross sectional view showing the step after the step shown in FIG. 5.

Then, after a predetermined amount of magnetic particles 205 is deposited in the openings 204, the mask 203 is dissolved with a given solvent such as acetone, to complete a magnetic substance 210 where a disc-shaped first magnetic layer 207 and a ring-shaped second magnetic layer 209 are successively stacked, as shown in FIG. 6.

The magnetic particles 205 may be deposited by a well known means such as vacuum deposition or sputtering. Herein, the angle θ is preferably set within 30–60 degrees. In this case, the magnetic particles 205 can be deposited on the main surface 202 and the side surfaces of the openings 204 efficiently, and then, the intended magnetic substance 210 can be made easily.

Figure 7:
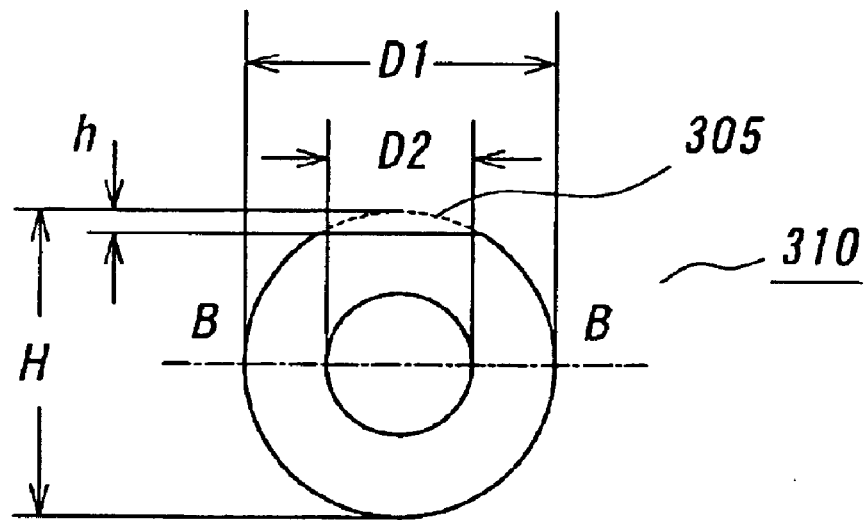
FIG. 7 is a top plan view showing another magnetic substance constituting another magnetic memory according to the present invention.
Figure 8:
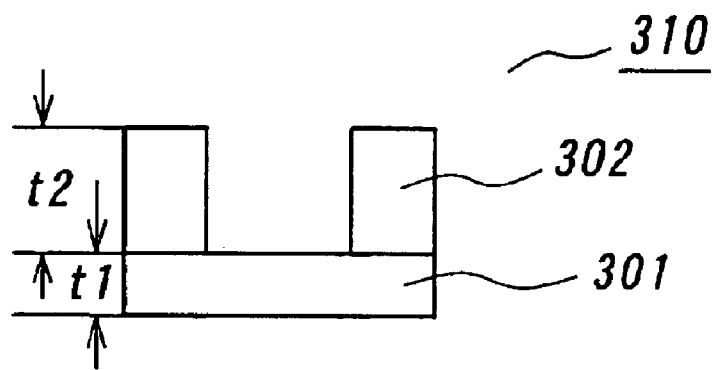
FIG. 8 is a cross sectional view of the magnetic substance shown in FIG. 7, taken on line "B—B"

FIG. 7 is a top plan view showing another magnetic substance constituting another magnetic memory according to the present invention, and FIG. 8 is a cross sectional view of the magnetic substance shown in FIG. 7, taken on line "B—B". The magnetic substance 310 illustrated in FIGS. 7 and 8 includes a disc-shaped first magnetic layer 301 and a ring-shaped magnetic layer 302 formed on the first magnetic layer 301. The periphery of the magnetic substance 310, that is, the peripheries of the first magnetic layer 301 and the second magnetic layer 302 are notched.

Since the periphery of the magnetic substance 310 is notched, the right handed (clockwise) vortex magnetization and the left handed (anticlockwise) vortex magnetization can be easily generated in the ring-shaped second magnetic layer 302, and information "0" or "1" can be easily stored in the direction of the vortex magnetization on good control of the direction of the vortex magnetization.

The height h of the notch 305 is set so as to satisfy the relation of the ratio (h/H)≧0.006 (H: the outside diameter of the magnetic substance 310). Not necessarily restricted, the ratio (h/H) is preferably set to 0.2 or below. If the ratio (h/H) is set beyond 0.2, the above-mentioned function can not be enhanced, and the vortex magnetization may not be formed in the second magnetic layer 302, resulting in the malfunction of the magnetic substance 310 as a magnetic memory.

The first magnetic layer 301 and the second magnetic layer 302 of the magnetic substance 310 may be made in the same manner as in the previous embodiment relating to FIGS. 1 and 2.

Figure 9:
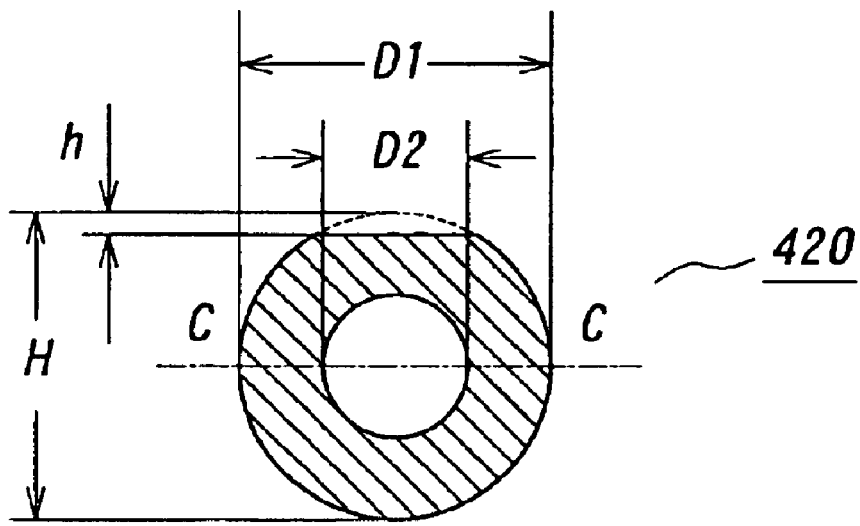
FIG. 9 is a top plan view showing a concrete magnetic memory including the magnetic substance shown in FIGS. 7 and 8.
Figure 10:
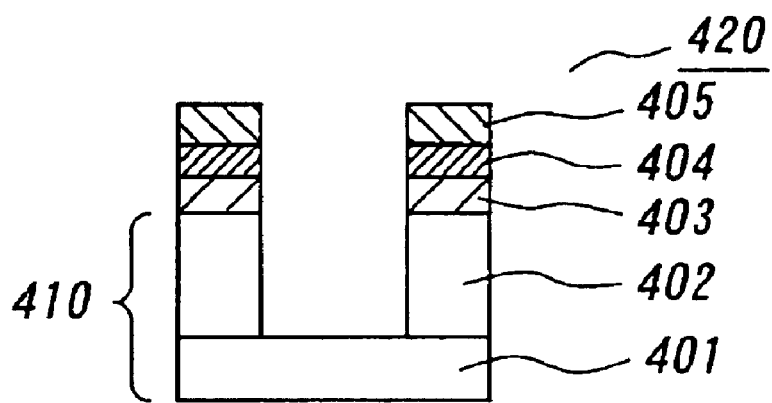
FIG. 10 is a cross sectional view showing the magnetic memory shown in FIG. 9, taken on line "C—C"

FIG. 9 is a top plan view showing a concrete magnetic memory including the magnetic substance shown in FIGS. 7 and 8, and FIG. 10 is a cross sectional view showing the magnetic memory shown in FIG. 9, taken on line "C—C").

With a magnetic memory 420 shown in FIGS. 9 and 10, a ring-shaped third magnetic layer 404 is formed via a ring-shaped non-magnetic layer 403 on a magnetic substance 410 composed of a disc-shaped first magnetic layer 401 and a ring-shaped second magnetic layer 402 which are successively stacked. Also, a ring-shaped antiferromagnetic layer 405 is formed on the third magnetic layer 404. The non-magnetic layer 403 through the antiferromagnetic layer 405 are formed concentrically for the magnetic substance 410.

The magnetic substance 410 may be made in the same manner as in the previous embodiment relating to FIGS. 7 and 8, and satisfies the above-mentioned requirements. In this point of view, if the thickness t1 of the first magnetic layer 401 and the thickness t2 of the second magnetic layer 402 which constitute the magnetic substance 410 are set within 4–20 nm, respectively, the thickness t3 of the third magnetic layer 404 is preferably set within 5–20 nm. Therefore, the reading operation for the magnetic memory can be performed in good condition as will be described hereinafter.

The third magnetic layer 404 may be made of the same room temperature ferromagnetic material as the first magnetic layer 401 and the second magnetic layer 402. The non-magnetic layer 403 may be made of non-magnetic material such as Cu, Ag or Au. The antiferromagnetic layer 405 may be made of antiferromagnetic material such as Mn—Ir, Mn—Pt or Fe—Mn. The thicknesses of the non-magnetic layer 403 and the antiferromagnetic layer 405 are appropriately determined so as to magnetically divide the magnetic substance 410 and the third magnetic layer 404 and magnetically pin the magnetization of the third magnetic layer 404 through exchange interaction.

The recording operation for the magnetic memory 420 shown in FIGS. 9 and 10 will be carried out as follows. FIG. 11 is a schematic view showing the magnetization state of the first magnetic layer 401 of the magnetic substance 410 when an external magnetic field is applied, and FIG. 12 is a schematic view showing the magnetization state of the second magnetic layer 402 of the magnetic substance 410 when the external magnetic field is applied. Herein, the arrow designates the direction of magnetization.

Figure 11A:
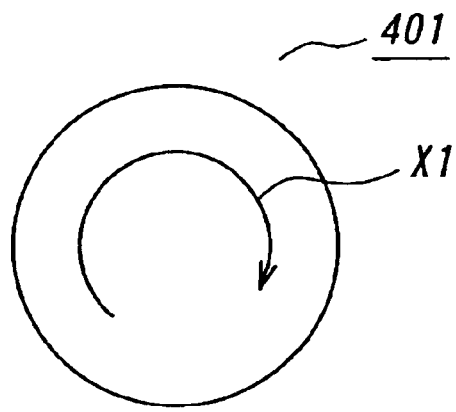
FIG. 11 is a schematic view showing the magnetization state of the first magnetic layer of the magnetic substance constituting the magnetic memory of the present invention when an external magnetic field is applied.
Figure 11B:
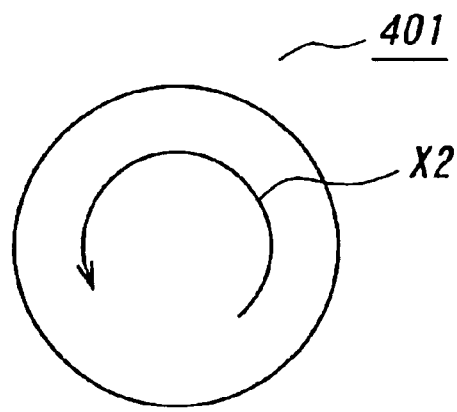
Figure 12A:
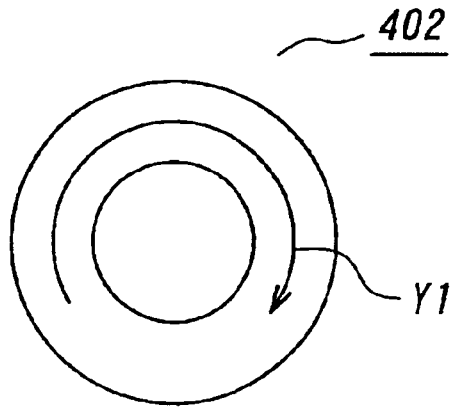
FIG. 12 is a schematic view showing the magnetization state of the second magnetic layer of the magnetic substance constituting the magnetic memory of the present invention when the external magnetic field is applied.
Figure 12B:
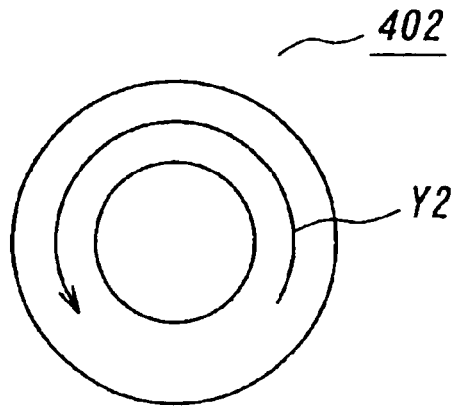

When an external magnetic field is applied to the magnetic memory 420 shown in FIGS. 9 and 10, as is apparent from FIG. 7, a right handed (clockwise) vortex magnetization X1 (FIG. 11(a)) or a left handed (anticlockwise) vortex magnetization X2 (FIG. 11(b)) are generated in the disc-shaped first magnetic layer 401 on the polarity of the external magnetic field. Since the first magnetic layer 401 are magnetically combined with the second magnetic layer 402, the vortex magnetization of the first magnetic layer 401 functions as nucleus to generate a corresponding right handed (clockwise) vortex magnetization Y1 (FIG. 12(a)) or a corresponding left handed (anticlockwise) vortex magnetization Y2 (FIG. 12(b)) in the second magnetic layer 402 along the surfaces thereof. In this way, the vortex magnetization can be formed easily in the second magnetic layer 402.

The vortex magnetizations X1 and X2 of the first magnetic layer 401 can be switched by the polarity of the external magnetic field, the vortex magnetizations Y1 and Y2 can be also switched easily on the switching of the vortex magnetizations X1 and X2. Therefore, the direction of the vortex magnetization of the second magnetic layer 402 can be controlled easily. As a result, if information "0" or "1" is stored on the vortex magnetization Y1 or Y2, the recording operation for the magnetic memory 420 can be performed stably, so that the magnetic memory 420 can be practically employed.

The reading operation for the magnetic memory 420 will be carried out as follows. The magnetization of the third magnetic layer 404 is pinned in a given direction, e.g., the right handed (clockwise) direction or the left handed (anticlockwise) direction through the exchange interaction with the antiferromagnetic layer 405. In this case, the electric resistance of the magnetic memory 420 depends on the relative direction of the vortex magnetization of the second magnetic layer 402 for the vortex magnetization of the third magnetic layer 404.

When the vortex magnetization of the second magnetic layer 402 is in parallel with the vortex magnetization of the third magnetic layer 404, the electric resistance of the magnetic memory 420 is rendered minimum, and when the vortex magnetization of the second magnetic layer 402 is in anti-parallel with the vortex magnetization of the third magnetic layer 404, the electric resistance of the magnetic memory 420 is rendered maximum. Therefore, if the above-mentioned recording operation is carried out for the magnetic memory 420 to generate the vortex magnetization while the magnetization of the third magnetic layer 404 is pinned in a predetermined direction, the reading operation can be performed by detecting the change in electric current due to the change in electric resistance of the magnetic memory 420.

EXAMPLE

The disc-shaped first magnetic layer and the ring-shaped second magnetic layer were made of Ni-20 at % alloy in thicknesses of 8 nm and 16 nm, respectively, and the outside diameter and the inside diameter of the second magnetic layer were set to 500 nm and 300 nm, respectively, to complete the magnetic substance as shown in FIGS. 1 and 2. Then, the variations in magnetization state of the first magnetic layer and the second magnetic layer were simulated.

Figure 13:
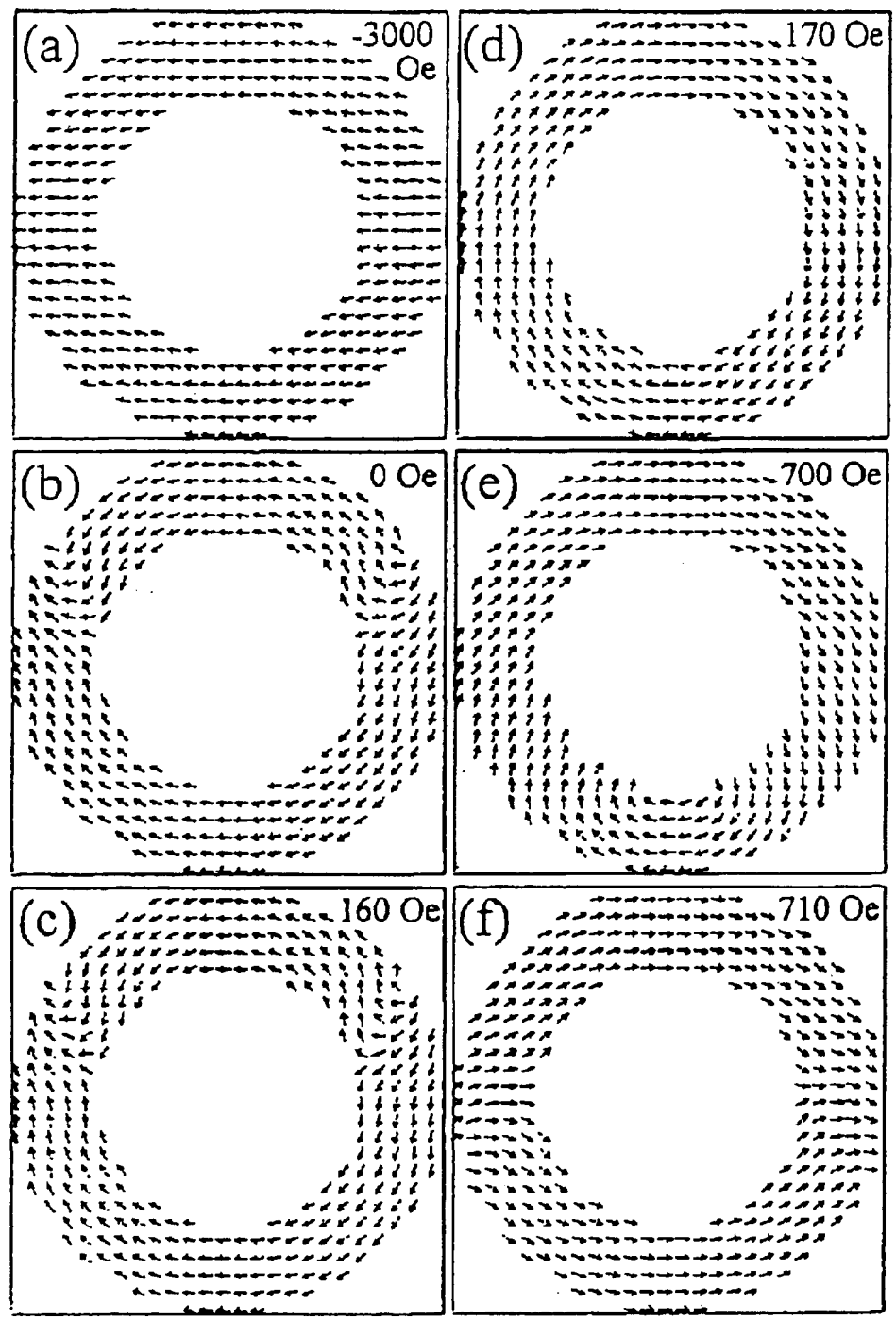
FIG. 13 is a simulated map showing the magnetization switching process of the second magnetic layer of the magnetic substance constituting the magnetic memory of the present invention.
Figure 14:
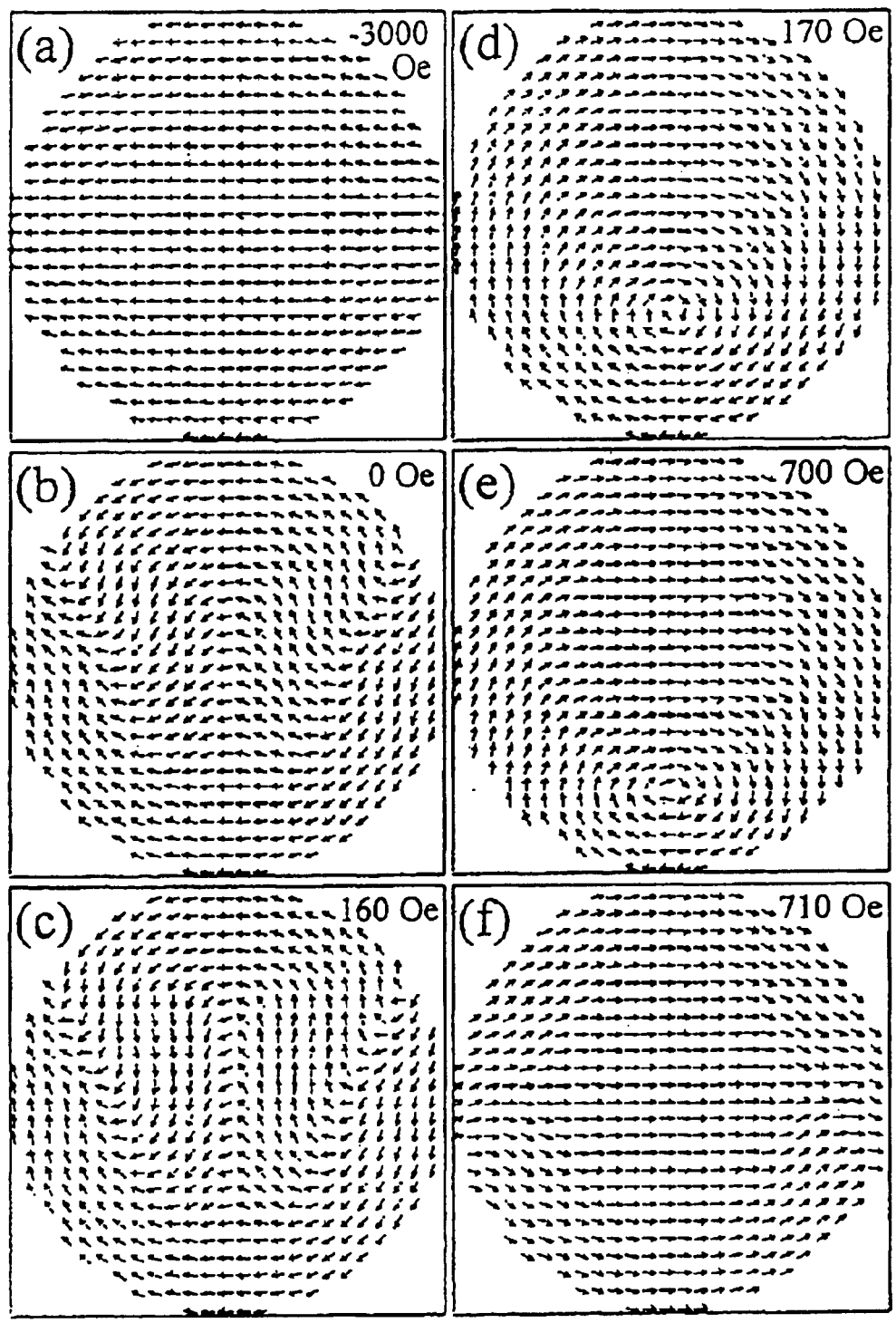
FIG. 14 is a simulated map showing the magnetization switching process of the first magnetic layer of the magnetic substance constituting the magnetic memory of the present invention.

FIG. 13 is a simulated map showing the magnetization switching process of the second magnetic layer, and FIG. 14 is a simulated map showing the magnetization switching process of the first magnetic layer. As is apparent from FIG. 13, the right handed (clockwise) vortex magnetization is induced in the second magnetic layer as the external magnetic field is increased from −3000 Oe, and then, the right handed (clockwise) vortex magnetization is clearly generated in the second magnetic layer at the magnetic field of about 170 Oe. As is apparent from FIG. 14, the right handed (clockwise) vortex magnetization is also clearly generated in the first magnetic layer at the magnetic field of about 170 Oe. Therefore, it was turned out that the right handed (clockwise) magnetization of the second magnetic layer was generated from the right handed (clockwise) vortex magnetization of the first magnetic layer as nucleus.

Although the present invention was described in detail with reference to the above examples, this invention is not limited to the above disclosure and every kind of variation and modification may be made without departing from the scope of the present invention.

As mentioned above, according to the present invention can be provided a magnetic memory and a magnetic memory array which can generate a right handed (clockwise) vortex magnetization and a left handed (anticlockwise) vortex magnetization easily to realize stable recording performance on the direction of the vortex magnetization. Moreover, a method for fabricating the magnetic memory, a method for recording in the magnetic memory and a method for reading out from the magnetic memory can be provided.

What is claimed is:

1. A magnetic memory comprising a magnetic substance composed of a disc-shaped first magnetic layer and a ring-shaped second magnetic layer which is formed on said first magnetic layer.

2. The magnetic memory as defined in claim 1, wherein ratio (D2/D1) is set within 0.1–0.8 on condition that an outside diameter and an inside diameter of said second magnetic layer are designated by D1 and D2, respectively.

3. The magnetic memory as defined in claim 2, wherein said outside diameter D1 of said second magnetic layer is set within 100–1500 nm and said inside diameter D2 of said second magnetic layer is set within 10–1200 nm.

4. The magnetic memory as defined in claim 1, wherein ratio (t1/t2) is set within 1/5–5 on condition that thicknesses of said first magnetic layer and said second magnetic layer are designated by t1 and t2, respectively.

5. The magnetic memory as defined in claim 4, wherein said thickness t1 of said first magnetic layer t1 is set within 4–20 nm, and said thickness t2 of said second magnetic layer t2 is set within 4–20 nm.

6. The magnetic memory as defined in claim 1, wherein said first magnetic layer and said second magnetic layer are made of room temperature ferromagnetic material.

7. The magnetic memory as defined in claim 1, wherein a magnetization of said second magnetic layer is rendered right handed (clockwise) direction or left handed (anticlockwise) direction along surfaces of said second magnetic layer.

8. The magnetic memory as defined in claim 1, wherein a periphery of said magnetic substance is notched.

9. The magnetic memory as defined in claim 8, wherein ratio (h/H) is set to 0.006 or over on condition that a height of a notch of said periphery of said magnetic substance is designated by h, and an outside diameter of said magnetic substance is designated by H.

10. The magnetic memory as defined in claim 1, further comprising a ring-shaped third magnetic layer on said magnetic substance via a non-magnetic layer.

11. The magnetic memory as defined in claim 10, wherein a thickness t3 of said third magnetic layer is set within 5–20 nm.

12. The magnetic memory as defined in claim 10, wherein said third magnetic layer is made of room temperature ferromagnetic material.

13. The magnetic memory as defined in claim 10, further comprising an antiferromagnetic layer so as to be adjacent to a main surface of said third magnetic layer remote from said magnetic substance.

14. The magnetic memory as defined in claim 10, wherein a magnetization of said third magnetic layer is rendered right handed (clockwise) direction or left handed (anticlockwise) direction along surfaces of said third magnetic layer.

15. The magnetic memory as defined in claim 14, wherein said direction of said third magnetic layer is pinned.

16. A magnetic memory array comprising a plurality of magnetic memories as defined in claim 1 which are arranged regularly.

17. A method for fabricating a magnetic memory, comprising the steps of:
preparing a given substrate,
forming a mask with circular openings on a main surface of said substrate,
introducing magnetic particles into said openings of said mask on said main surface of said substrate at a given inclination angle from a normal line to said main surface with rotating said substrate, to form a magnetic substance composed of a disc-shaped first magnetic layer and a ring-shaped second magnetic layer which are successively stacked.

18. The fabricating method as defined in claim 17, wherein said inclination angle is set within 30–60 degrees from said normal line to said main surface.

19. A method for recording in a magnetic memory, comprising the steps of:
stacking a disc-shaped first magnetic layer and a ring-shaped second magnetic layer successively to form a magnetic substance,
applying an external magnetic field to said magnetic substance to generate a vortex magnetization in said first magnetic layer,
generating a right handed (clockwise) vortex magnetization or a left handed (anticlockwise) vortex magnetization in said second magnetic layer along surfaces of said magnetic layer by utilizing said vortex magnetization of said first magnetic layer as nucleus, and
storing information "0" or "1" on said right handed (clockwise) vortex magnetization or said left handed (anticlockwise) vortex magnetization of said second magnetic layer.

20. The recording method as defined in claim 19, wherein ratio (D2/D1) is set within 0.1–0.8 on condition that an outside diameter and an inside diameter of said second magnetic layer are designated by D1 and D2, respectively.

21. The recording method as defined in claim 20, wherein said outside diameter D1 of said second magnetic layer is set within 100–1500 nm and said inside diameter D2 of said second magnetic layer is set within 10–1200 nm.

22. The recording method as defined in claim 19, wherein ratio (t1/t2) is set within 1/5–5 on condition that thicknesses of said first magnetic layer and said second magnetic layer are designated by t1 and t2, respectively.

23. The recording method as defined in claim 22, wherein said thickness t1 of said first magnetic layer t1 is set within 4–20 nm, and said thickness t2 of said second magnetic layer t2 is set within 4–20 nm.

24. The recording method as defined in claim 19, wherein said first magnetic layer and said second magnetic layer are made of room temperature ferromagnetic material.

25. The recording method as defined in claim 19, wherein a periphery of said magnetic substance is notched.

26. The recording method as defined in claim 25, wherein ratio (h/H) is set to 0.006 or over on condition that a height of a notch of said periphery of said magnetic substance is designated by h, and an outside diameter of said magnetic substance is designated by H.

27. A method for reading out from a magnetic memory, comprising the steps of:
  stacking a disc-shaped first magnetic layer and a ring-shaped second magnetic layer successively to form a magnetic substance,
  forming a ring-shaped third magnetic layer on said magnetic substance via a non-magnetic layer, to complete said magnetic memory,
  applying an external magnetic field to said magnetic substance to generate a vortex magnetization in said first magnetic layer,
  generating a right handed (clockwise) vortex magnetization or a left handed (anticlockwise) vortex magnetization in said second magnetic layer along surfaces of said magnetic layer by utilizing said vortex magnetization of said first magnetic layer as nucleus,
  storing information "0" or "1" on said right handed (clockwise) vortex magnetization or said left handed (anticlockwise) vortex magnetization of said second magnetic layer, and
  detecting a change in electric current due to a change in electric resistance of said magnetic memory on relative direction of a magnetization of said second magnetic layer for a magnetization of said third magnetic layer.

28. The reading out method as defined in claim 27, further comprising the step of forming an antiferromagnetic layer so as to be adjacent to a main surface of said third magnetic layer remote from said magnetic substance to pin said magnetization of third magnetic layer.

29. The reading out method as defined in claim 27, wherein ratio (D2/D1) is set within 0.1–0.8 on condition that an outside diameter and an inside diameter of said second magnetic layer are designated by D1 and D2, respectively.

30. The reading out method as defined in claim 29, wherein said outside diameter D1 of said second magnetic layer is set within 100–1500 nm and said inside diameter D2 of said second magnetic layer is set within 10–1200 nm.

31. The reading out method as defined in claim 27, wherein a periphery of said magnetic substance is notched.

32. The reading out method as defined in claim 31, wherein ratio (h/H) is set to 0.006 or over on condition that a height of a notch of said periphery of said magnetic substance is designated by h, and an outside diameter of said magnetic substance is designated by H.

33. The reading out method as defined in claim 27, wherein a thickness t1 of said first magnetic layer t1 is set within 4–20 nm, and a thickness t2 of said second magnetic layer t2 is set within 4–20 nm.

34. The reading out method as defined in claim 27, wherein said first magnetic layer, said second magnetic layer and said third magnetic layer are made of room temperature ferromagnetic material.

\* \* \* \* \*

UNITED STATES PATENT AND TRADEMARK OFFICE
CERTIFICATE OF CORRECTION

PATENT NO. : 6,940,750 B2  
APPLICATION NO. : 10/680157  
DATED : September 6, 2005  
INVENTOR(S) : Yamamoto et al.

Page 1 of 1

It is certified that error appears in the above-identified patent and that said Letters Patent is hereby corrected as shown below:

Title Page

Item (56), under "OTHER PUBLICATIONS", in Column 2, Line 6, delete "Mangets,"" and insert -- Magnets," --, therefor.

In the Specifications

In Column 1, Line 65, in Heading, delete "SUMMERY" and insert -- SUMMARY --, therefor.

In Column 2, Line 64, delete "wherein" and insert -- wherein: --, therefor.

In Column 3, Line 40, in Heading, delete "DESCRIPTION" and insert -- DETAILED DESCRIPTION --, therefor.

Signed and Sealed this  
Eleventh Day of June, 2013

Teresa Stanek Rea  
*Acting Director of the United States Patent and Trademark Office*